(12) United States Patent
Hasunuma et al.

(10) Patent No.: US 6,815,318 B2
(45) Date of Patent: Nov. 9, 2004

(54) MANUFACTURING METHOD OF SEMICONDUCTOR DEVICE

(75) Inventors: Eiji Hasunuma, Hyogo (JP); Akira Matsumura, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/350,184

(22) Filed: Jan. 24, 2003

(65) Prior Publication Data

US 2004/0053482 A1 Mar. 18, 2004

(30) Foreign Application Priority Data

Sep. 17, 2002 (JP) .................................. 2002-270148

(51) Int. Cl.⁷ .............................................. H01L 21/425
(52) U.S. Cl. ...................... 438/525; 438/527; 438/531; 438/533; 438/914; 438/944
(58) Field of Search ................................. 438/527, 533, 438/914, 525, 531, 944, FOR 240

(56) References Cited

U.S. PATENT DOCUMENTS 5,972,745 A * 10/1999 Kalter et al. ................. 438/220
6,291,325 B1 * 9/2001 Hsu ............................. 438/525
6,518,122 B1 * 2/2003 Chan et al. .................. 438/257
2004/0002203 A1 * 1/2004 Deshpande et al. ......... 438/525

FOREIGN PATENT DOCUMENTS

JP 08-78637 3/1996

* cited by examiner

Primary Examiner—George Fourson
Assistant Examiner—Michelle Estrada
(74) Attorney, Agent, or Firm—McDermott Will & Emery LLP

(57) ABSTRACT

When an opening diameter of a top end of a substantially column-shaped contact hole is S1, an opening diameter of a top end of a substantially column-shaped contact hole is T1, and a thickness of a silicon insulating layer is h, then contact holes are formed so as to satisfy the following conditional expression 1. T1/h<tan θ1<S1/h (expression 1). With this formation method, a manufacturing method of a semiconductor device can be provided which does not need covering processing using a photolithography technique when impurity regions of different conductivity types are formed using contact holes.

5 Claims, 7 Drawing Sheets

MANUFACTURING METHOD OF SEMICONDUCTOR DEVICE

BACKGROUND OF THE INVENTION

1. Field of the Invention

The present invention relates to a manufacturing method of a semiconductor device and, more specifically, to a manufacturing method of a semiconductor device including an impurity region used for an interconnection structure.

2. Description of the Background Art

A formation method of an impurity region of an interconnection structure applied to common DRAM (Dynamic Random Access Memory) will now be described referring to FIGS. 12–14.

Referring to FIG. 12, an element isolation region 12 is provided in a surface of a semiconductor layer (including semiconductor substrate) 10 to define an active region. An n-type impurity region 21 and a p-type impurity region 22 doped with impurities are provided in this active region. On the surface of semiconductor layer 10, a silicon insulating layer 11 provided with a contact hole 51a connecting to n-type impurity region 21 and a contact hole 52a connecting to p-type impurity region 22 is provided.

A contact plug 51 electrically connected to n-type impurity region 21 is provided within contact hole 51a, and a contact plug 52 electrically connected to p-type impurity region 22 is provided within contact hole 52a. An n+ type impurity region 21a for decreasing a contact resistance with contact plug 51 is formed within n-type impurity region 21, and a p+ type impurity region 22a for decreasing a contact resistance with contact plug 52 is formed within p-type impurity region 22.

A manufacturing method of a semiconductor device having the above-described structure will briefly be described. Referring to FIG. 13, element isolation region 12 is formed in a prescribed region of the surface of semiconductor layer 10. Thereafter, n-type impurity region 21 and p-type impurity region 22 are formed in the active region of semiconductor layer 10 by impurity implantation.

Silicon insulating layer 11 is then formed on the surface of semiconductor layer 10. Contact holes 51a, 52a respectively connecting to n-type impurity region 21 and p-type impurity region 22 are formed in silicon insulating layer 11 using a dry etching method such as a RIE (Reactive Ion Etching) method using a photoresist film on silicon insulating layer 11 having a prescribed opening pattern as a mask using a photolithography technique.

Contact hole 51a is then covered with a resist film 14, and a p-type impurity such as B or $BF_2$ is implanted into the surface of semiconductor layer 10 through contact hole 52a to form p+ type impurity region 22a.

Referring to FIG. 14, after removing resist film 14, contact hole 52a is covered with a new resist film 14, and an n-type impurity such as P or As is implanted into the surface of semiconductor layer 10 through contact hole 51a to form n+ type impurity region 21a.

Thereafter, contact plugs 51, 52, which are made of polysilicon or the like and are electrically connected to n+ type impurity region 21a and p+ type impurity region 22a respectively, are formed by filling contact holes 51a, 52a.

The aforementioned element isolation region 12 is an isolation region formed by a method such as an embedding method of a thermal oxide film or an oxide film. In addition, silicon insulating layer 11 is an insulator film such as a TEOS (Tetra Etyle Ortho Silicate) oxide film or a nitride film, or a film formed by superimposing these films, which is deposited using a low-pressure or normal-pressure CVD (Chemical Vapor Deposition) method, and has a thickness of about 50 nm–1000 nm.

In the above-described manufacturing method, the impurity region is formed for decreasing the contact resistance using the contact hole. For forming n+ type impurity region 21a and p+ type impurity region 22a having different conductivity types, however, covering processing using the photolithography technique to cover the other contact hole with a resist film is necessary in each impurity implantation step to semiconductor layer 10. This increases manufacturing steps and manufacturing cost of the semiconductor device.

SUMMARY OF THE INVENTION

The present invention was made to solve the above-described problem. An object of the present invention is to provide a manufacturing method of a semiconductor device which does not need covering processing using a photolithography technique when impurity regions of different conductivity types are formed using contact holes.

In a manufacturing method of a semiconductor device according to the present invention, a first conductivity type impurity region and a second conductivity type impurity region are included in a semiconductor layer. The method includes the steps of: forming on the semiconductor layer an insulating layer including a first contact hole having a top-end opening shape exposing a surface of the semiconductor layer for an implantation angle of an impurity to a normal of the semiconductor layer and a second contact hole having a top-end opening shape blocking a surface of the semiconductor layer for the implantation angle; implanting an impurity of a first conductivity type into the semiconductor layer with the implantation angle using the insulating layer as a mask to form the first conductivity type impurity region only in a surface portion of the semiconductor layer exposed by the first contact hole; and forming the second conductivity type impurity region only in a surface portion of the semiconductor layer exposed by the second contact hole using the second contact hole of the insulating layer.

According to the above-described manufacturing method of a semiconductor device, when forming first and second impurity regions of different conductivity types using contact holes having different opening shapes, one impurity can be implanted at the first contact hole because the surface portion of the semiconductor layer is exposed for the implantation angle of the impurity to a normal of the semiconductor layer, while the impurity is not implanted at the other contact hole because the surface portion of the semiconductor layer is blocked.

As a result, it is unnecessary to form a conventionally required photoresist to prevent an impurity from being implanted into other regions when the impurity is implanted into a prescribed region. Therefore, manufacturing steps of the semiconductor device can become more simple, and the manufacturing cost can be reduced.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
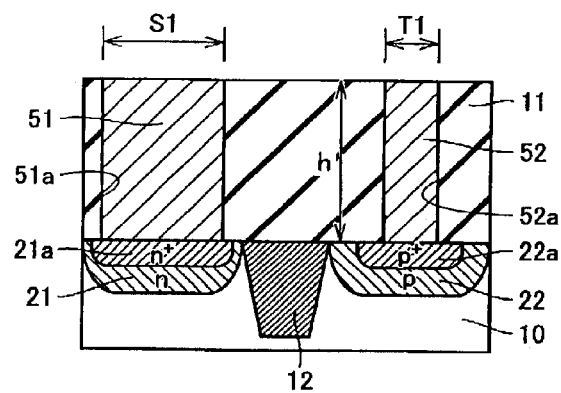
FIG. 1 is a cross-sectional view of a structure of a semiconductor device according to a first embodiment.

A semiconductor device and a manufacturing method thereof according to each embodiment of the present invention will now be described referring to the drawings. The present invention is characterized in that, impurity regions of different conductivity types for decreasing a contact resistance are formed using contact holes having different opening shapes. The same reference characters indicate the same or corresponding portions of the structure of the above-described prior art, and the descriptions thereof will not be repeated.

(First Embodiment)

A semiconductor device and a manufacturing method thereof according to a first embodiment will now be described with reference to FIGS. 1–4.

(Structure of Semiconductor Device)

Referring to FIG. 1, a structure of the semiconductor device of this embodiment includes column-shaped contact plug 51 connecting to n+ type impurity region 21a and column-shaped contact plug 52 connecting to p+ type impurity region 22a. Though contact hole 51a, in which contact plug 51 is formed, and contact hole 52a, in which contact plug 52 is formed, are formed to have the same opening shape in the prior art, contact holes in this embodiment are formed such that, a top end of contact hole 51a has a larger opening diameter than that of contact hole 52a.

More specifically, when the opening diameter of the top end of substantially column-shaped contact hole 51a is S1, the opening diameter of the top end of substantially column-shaped contact hole 52a is T1, and a thickness of silicon insulating layer 11 is h, then contact holes 51a and 52a are formed so as to satisfy the following condition (expression 1).

$$T1/h < \tan \theta 1 < S1/h \quad \text{(expression 1)}$$

Herein, θ1 shows an implantation angle of an impurity, which will be described below. More specifically, it shows an inclination from a normal of a surface of a semiconductor layer.

(Manufacturing Method of Semiconductor Device)

The manufacturing method of the semiconductor device having the above-described structure will now be described with reference to FIGS. 2–4. Because the step of forming n-type impurity region 21 and p-type impurity region 22 in the surface of semiconductor layer 10 is similar to that in the prior art, the description thereof will not be repeated.

Figure 2:
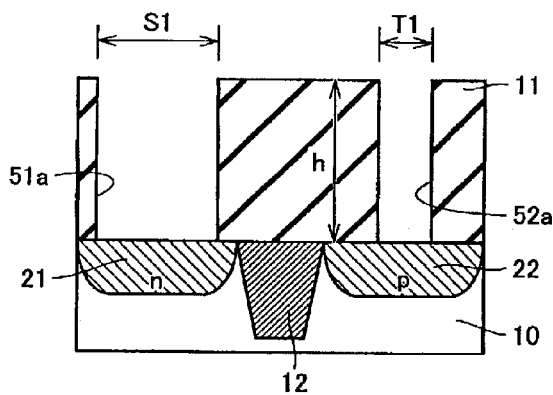
FIGS. 2–4 are cross-sectional views respectively indicating first to third steps of a manufacturing process of the semiconductor device according to the first embodiment.

Referring to FIG. 2, silicon insulating layer 11 having thickness h is formed on a surface of semiconductor layer 10. Then, column-shaped contact hole 51a having the top-end opening diameter S1 and connecting to n-type impurity region 21 and column-shaped contact hole 52a having the top-end opening diameter T1 and connecting to p-type impurity region 22 are formed in silicon insulating layer 11.

Each contact hole is opened by a dry etching method such as the RIE method as a conventional method, using a photoresist film having an opening pattern corresponding to respective opening diameters of contact holes 51a and 52a as a mask using the photolithography technique. Dimensions h, S1 and T1 are determined so as to satisfy the above-described expression 1. An example of each dimension is about 0.20 μm for S1, about 0.10 μm for T1, and about 1000 nm for h.

Figure 3:
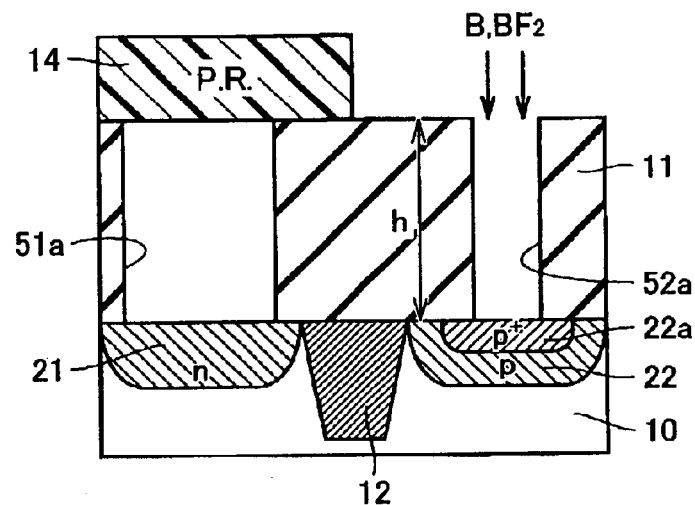

Referring to FIG. 3, photoresist film 14 is formed so as to cover contact hole 51a. Thereafter, a p-type impurity such as B or BF$_2$ is implanted into semiconductor layer 10 using photoresist film 14 as a mask to form p+ type impurity region 22a for decreasing the contact resistance with contact plug 52.

Figure 4:
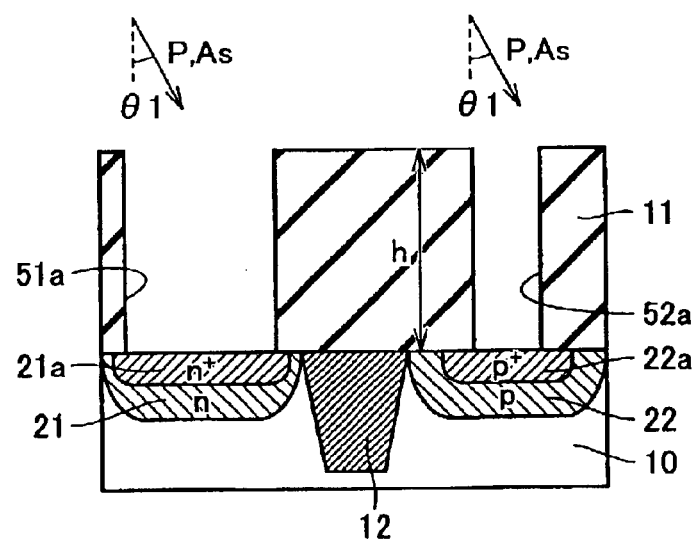

Referring to FIG. 4, after photoresist film 14 is removed, an n-type impurity such as P or As is implanted into the whole surface of semiconductor layer 10 with an angle inclined by θ1 from a normal of the surface of semiconductor layer 10 to decrease the contact resistance with contact plug 51. The angle θ1 will be, for example, about 6 to 11 degrees by the relation with the expression 1.

With the condition indicated by the expression 1, as contact hole 51a has the top-end opening shape exposing the surface of semiconductor layer 10 for implantation angle θ1, all of the exposed region of semiconductor layer 10 is doped with the n-type impurity such as P or As. Contact hole 52a, however, has the top-end opening shape blocking the surface of semiconductor layer 10 for implantation angle θ1. That is, with implantation angle θ1, the n-type impurity is inhibited by the top surface of silicon insulating layer 11 and the sidewall of contact hole 52a and cannot reach the surface of semiconductor layer 10. Therefore, the n-type impurity is not implanted into semiconductor layer 10 at contact hole 52a.

Contact plugs 51, 52, which are made of polysilicon or the like and are electrically connected to n+ type impurity region 21a and p+ type impurity region 22a respectively, are then formed by filling contact holes 51a, 52a as in the prior art.

(Function and Effect)

As described above, in the semiconductor device and the manufacturing method thereof according to this embodiment, formation of a photoresist to prevent the n-type impurity from being implanted into p+ type impurity region 22a becomes unnecessary by implanting the n-type impurity so as to satisfy the condition of the expression 1 when impurity regions 21a, 22a of different conductivity types for decreasing the contact resistance are formed using contact holes having different opening diameters.

That is, for the implantation angle of one impurity to a normal of the semiconductor layer, the impurity can be implanted at the first contact hole because the surface portion of the semiconductor layer is exposed, but the impurity is not implanted at the other contact hole because the surface portion of the semiconductor layer is blocked.

As a result, manufacturing steps of the semiconductor device can become more simple, and the manufacturing cost can be reduced.

(Second Embodiment)

A semiconductor device and a manufacturing method thereof according to a second embodiment will now be described with reference to FIGS. 5–8.

(Structure of Semiconductor Device)

Figure 5:
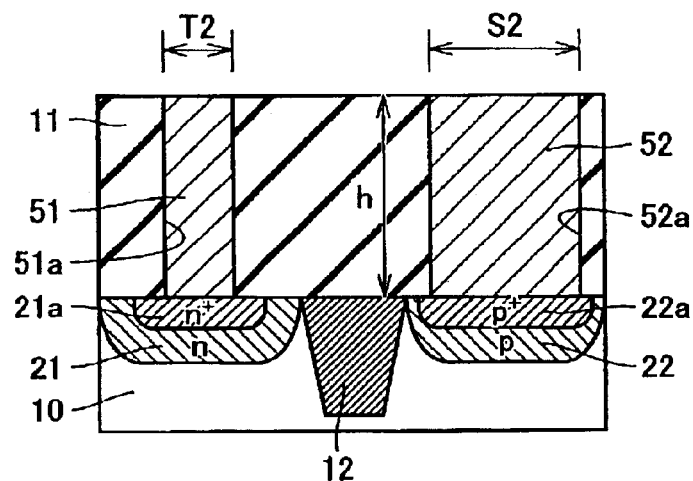
FIG. 5 is a cross-sectional view of a structure of a semiconductor device according to a second embodiment.

Referring to FIG. 5, a structure of the semiconductor device of this embodiment is formed with column-shaped contact plug 51 connecting to n+ type impurity region 21a and column-shaped contact plug 52 connecting to p+ type impurity region 22a. Though contact holes in the first embodiment are formed such that the top end of contact hole 51a has a larger opening diameter than that of contact hole 52a, in this embodiment, contact holes are formed such that the top end of contact hole 52a has a larger opening diameter than that of contact hole 51a.

More specifically, when the opening diameter of the top end of column-shaped contact hole 51a is T2, the opening diameter of the top end of column-shaped contact hole 52a is S2, and a thickness of silicon insulating layer 11 is h, then contact holes 51a and 52a are formed so as to satisfy the following condition (expression 2).

$$T2/h < \tan\theta 2 < S2/h \quad \text{(expression 2)}$$

Herein, θ2 shows an implantation angle of an impurity as in the first embodiment. More specifically, it shows an inclination from a normal of a surface of a semiconductor layer.

(Manufacturing Method of Semiconductor Device)

The manufacturing method of the semiconductor device having the above-described structure will now be described with reference to FIGS. 6–8. Because the step of forming n-type impurity region 21 and p-type impurity region 22 in the surface of semiconductor layer 10 is similar to that in the prior art, the description thereof will not be repeated.

Figure 6:
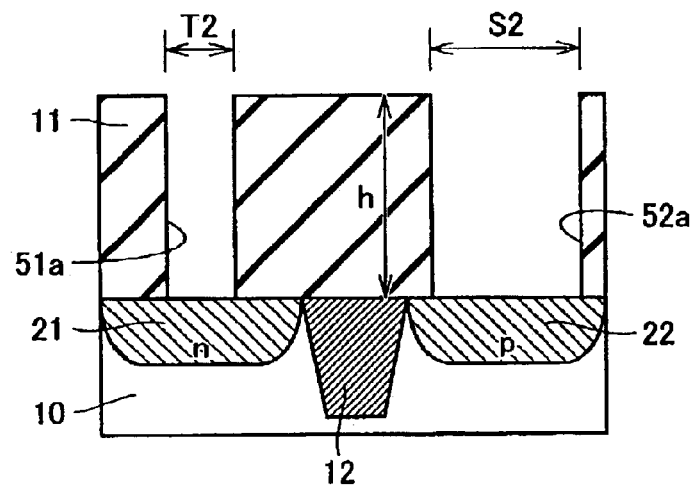
FIGS. 6–8 are cross-sectional views respectively indicating first to third steps of a manufacturing process of the semiconductor device according to the second embodiment.

Referring to FIG. 6, silicon insulating layer 11 having thickness h is formed on a surface of semiconductor layer 10. Then, column-shaped contact hole 51a having opening diameter T2 and connecting to n-type impurity region 21 and column-shaped contact hole 52a having opening diameter S2 and connecting to p-type impurity region 22 are formed in silicon insulating layer 11.

Each contact hole is opened by a dry etching method such as the RIE method as a conventional method, using a photoresist film having an opening pattern corresponding to respective opening diameters of contact holes 51a and 52a as a mask using the photolithography technique. Dimensions h, S2 and T2 are determined so as to satisfy the above-described expression 2. An example of each dimension is about 0.20 μm for S2, about 0.10 μm for T2, and about 1000 nm for h.

Figure 7:
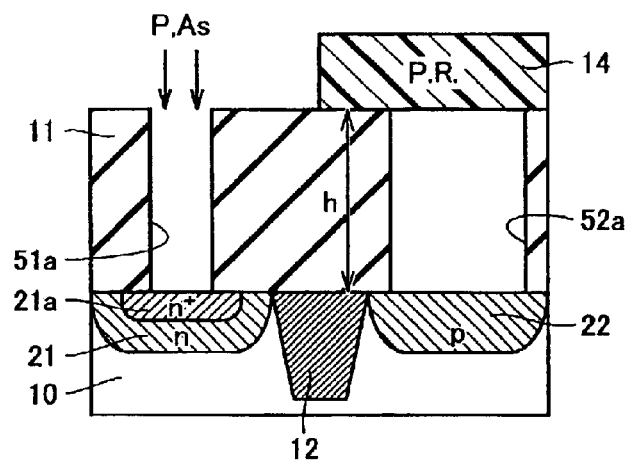

Referring to FIG. 7, photoresist film 14 is formed so as to cover contact hole 52a. Thereafter, an n-type impurity such as P or As is implanted into semiconductor layer 10 using photoresist film 14 as a mask to form n+ type impurity region 21a for decreasing the contact resistance with contact plug 51.

Figure 8:
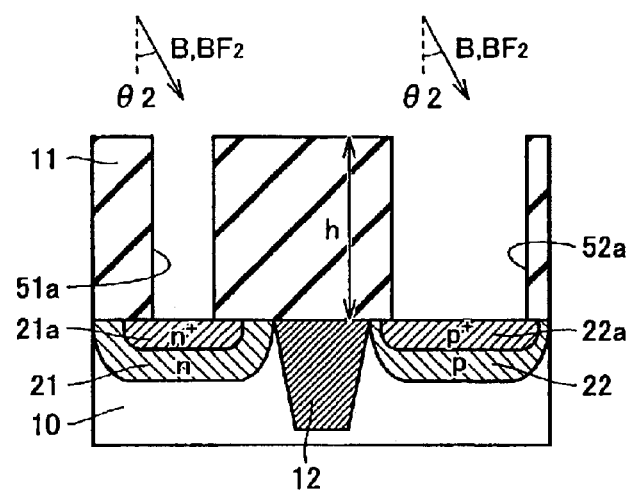

Referring to FIG. 8, after photoresist film 14 is removed, a p-type impurity such as B or $BF_2$ is implanted into the whole surface of semiconductor layer 10 with an angle inclined by θ2 from a normal of the surface of semiconductor layer 10 to decrease the contact resistance with contact plug 52. The angle θ2 will be, for example, about 6 to 11 degrees by the relation with the expression 2.

With the condition indicated by the expression 2, as contact hole 52a has the top-end opening shape exposing the surface of semiconductor layer 10 for implantation angle θ2, all of the exposed region of semiconductor layer 10 is doped with the p-type impurity such as B or $BF_2$. Contact hole 51a, however, has the top-end opening shape blocking the surface of semiconductor layer 10 for implantation angle θ2. That is, with implantation angle θ2, the p-type impurity is inhibited by the top surface of silicon insulating layer 11 and the sidewall of contact hole 51a, and cannot reach the surface of semiconductor layer 10. Therefore, the p-type impurity is not implanted into semiconductor layer 10 at contact hole 51a.

Contact plugs 51, 52, which are made of polysilicon or the like and are electrically connected to n+ type impurity region 21a and p+ type impurity region 22a respectively, are then formed by filling contact holes 51a, 52a as in the prior art.

(Function and Effect)

As described above, in this embodiment, formation of a photoresist to prevent the p-type impurity from being implanted into n+ type impurity region 21a becomes unnecessary by implanting the p-type impurity so as to satisfy the condition of the above-described expression 2 when impurity regions 21a, 22a of different conductivity types for decreasing the contact resistance are formed using contact holes having different opening diameters. As a result, manufacturing steps of the semiconductor device can become more simple, and the manufacturing cost can be reduced.

(Third Embodiment)

Figure 9:
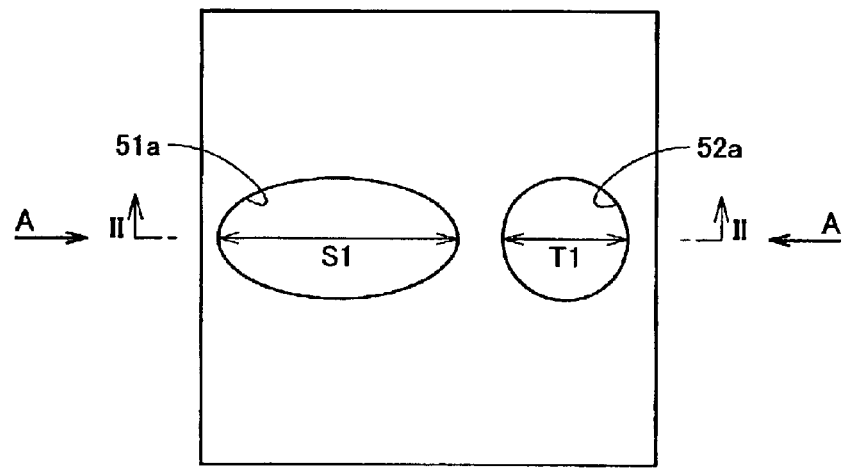
FIG. 9 shows opening shapes of top ends of contact holes 51a, 52a according to a third embodiment.

A structure of a semiconductor device according to a third embodiment will now be described with reference to FIG. 9. FIG. 9 shows opening shapes of top ends of contact holes 51a, 52a.

Though the opening shape of the cross-section of the top end of contact hole 51a in the first embodiment is substantially circular, contact hole 51a in this embodiment has a substantially elliptical opening shape of the cross-section of the top end. Contact hole 52a is similar to that in the first embodiment.

In contact hole 51a having such an opening shape, when the dimension of the longest region in the opening dimension of the top end (major axis dimension) is S1 as in the first embodiment, the cross-sectional structure taken along the line II—II in the drawing will be similar to that shown in FIG. 2 in the first embodiment.

(Function and Effect)

Therefore, the opening shape of the contact hole is not limited to that shown in the first embodiment, and the similar effect as with the first embodiment can also be obtained with the opening shape in this embodiment. It is to be noted that, the n-type impurity must be implanted along the direction of the major axis of contact hole 51a (direction indicated by an arrow A in FIG. 9).

(Fourth Embodiment)

Figure 10:
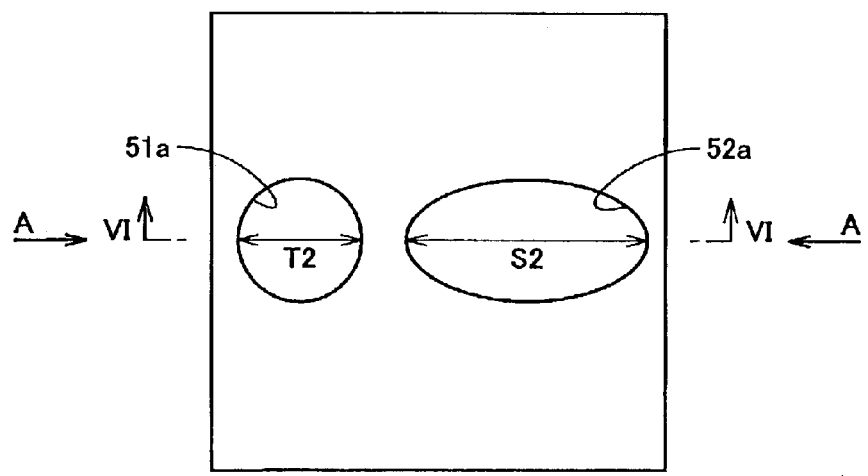
FIG. 10 shows opening shapes of top ends of contact holes 51a, 52a according to a fourth embodiment.

A structure of a semiconductor device according to a fourth embodiment will now be described with reference to FIG. 10. FIG. 10 shows opening shapes of top ends of contact holes 51a, 52a.

Though the opening shape of the cross-section of the top end of contact hole 52a in the second embodiment is substantially circular, contact hole 52a in this embodiment has a substantially elliptical opening shape of the cross-section of the top end. Contact hole 51a is similar to that in the second embodiment.

In contact hole 52a having such an opening shape, when the dimension of the longest region in the opening dimension of the top end (major axis dimension) is S2 as in the second embodiment, the cross-sectional structure taken along the line VI—VI in the drawing will be similar to that shown in FIG. 6 in the second embodiment.

(Function and Effect)

Therefore, the opening shape of the contact hole is not limited to that shown in the second embodiment, and the similar effect as with the second embodiment can also be obtained with the opening shape in this embodiment. It is to be noted that, the p-type impurity must be implanted along the direction of the major axis of contact hole 52a (direction indicated by arrow A in FIG. 10).

(Fifth Embodiment)

A semiconductor device according to a fifth embodiment will now be described with reference to FIG. 11. In this embodiment, ideas shown in the third and fourth embodiments are combined.

Contact hole 51a in this embodiment has a substantially elliptical cross-sectional opening shape having a major axis dimension of S3 and a minor axis dimension of T4. On the other hand, contact hole 52a has an opening shape having a major axis dimension of S4 and a minor axis dimension of T3, and is provided such that the major axis is orthogonal to the major axis of contact hole 51a.

In addition, major axis dimension S3 of contact hole 51a is made larger than minor axis dimension T3 of contact hole 52a, while major axis dimension S4 of contact hole 52a is made larger than minor axis dimension T4 of contact hole 51a.

Figure 11:
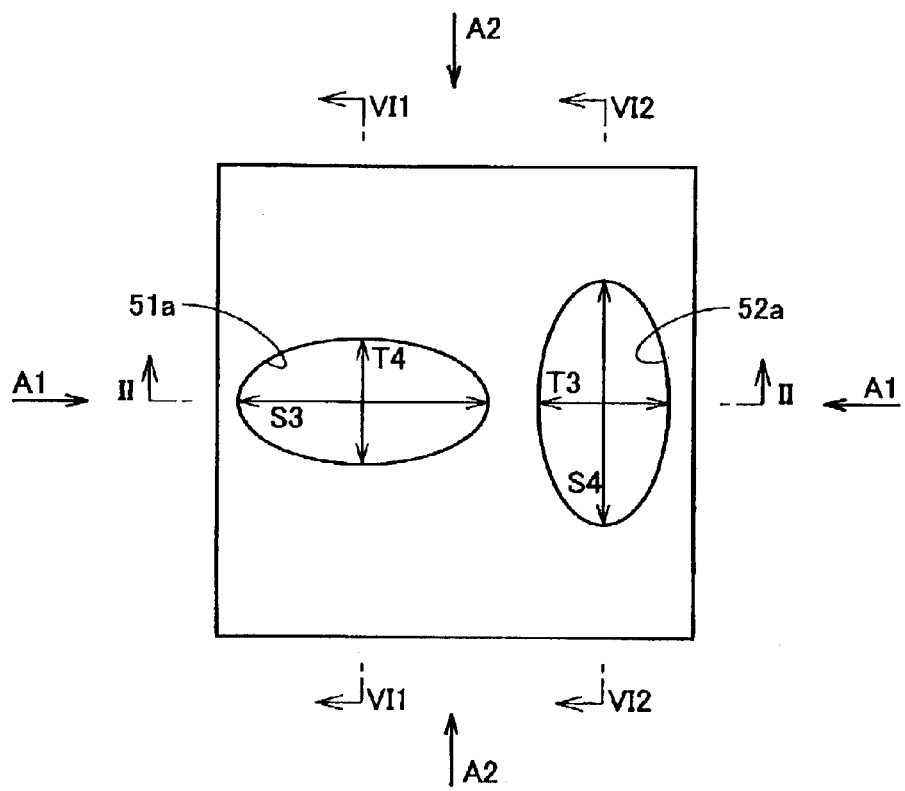
FIG. 11 shows opening shapes of top ends of contact holes 51a, 52a according to a fifth embodiment.
Figure 12:
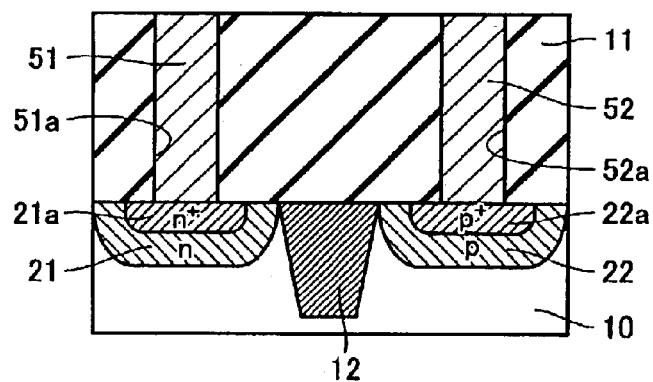
FIG. 12 is a cross-sectional view of a structure of a semiconductor device according to a prior art.
Figure 13:
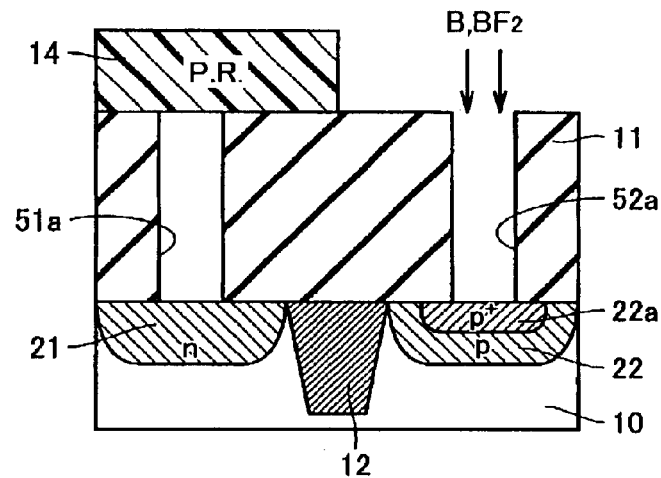
FIGS. 13 and 14 are cross-sectional views respectively indicating first and second steps of a manufacturing process of the semiconductor device according to the prior art.
Figure 14:
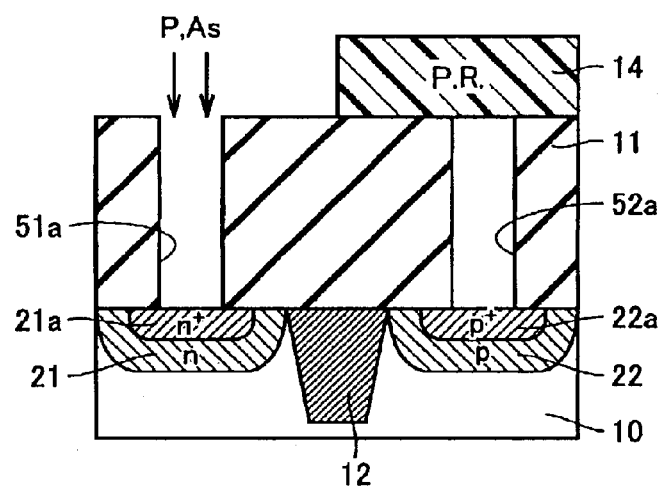

With this, the cross-sectional structure taken along the line II—II in FIG. 11 will be similar to that shown in FIG. 2 in the first embodiment. Further, the cross-sectional structure taken along the line VI1—VI1 in FIG. 11 will be similar to that of contact hole 51a shown in FIG. 6 in the second embodiment, while the cross-sectional structure taken along the line VI2—VI2 in FIG. 11 will be similar to that of contact hole 52a shown in FIG. 6 in the second embodiment.

As a result, when the n-type impurity is implanted along the major axis direction of contact hole 51a (direction indicated by an arrow A1) while an implantation angle θ3 of the n-type impurity is set so as to satisfy the following expression 3, the n-type impurity can be implanted into the surface portion of semiconductor layer 10 at contact hole 51a, but the n-type impurity cannot be implanted into the surface portion of semiconductor layer 10 at contact hole 52a.

$$T3/h < \tan\theta 3 < S3/h \quad \text{(expression 3)}$$

Furthermore, when the p-type impurity is implanted along the major axis direction of contact hole 52a (direction indicated by an arrow A2) while an implantation angle θ4 of the p-type impurity is set so as to satisfy the following expression 4, the p-type impurity can be implanted into the surface portion of semiconductor layer 10 at contact hole 52a, but the p-type impurity cannot be implanted into the surface portion of semiconductor layer 10 at contact hole 51a.

$$T4/h < \tan\theta 4 < S4/h \quad \text{(expression 4)}$$

(Function and Effect)

As described above, in this embodiment, formation of a photoresist to prevent one impurity from being implanted into the other impurity region becomes unnecessary by implanting the n-type and p-type impurities with respective implantation angles which are different from each other by 90 degrees so as to satisfy the conditions of the above-described expressions 3 and 4, when impurity regions 21a, 22a of different conductivity types for decreasing the contact resistance are formed using contact holes having different opening diameters. As a result, manufacturing steps of the semiconductor device can further become simple, and the manufacturing cost can further be reduced.

Though an example of forming impurity regions 21a, 22a in impurity regions 21, 22 is described in each of the embodiments, impurity regions 21, 22 are not essential to implement the present invention, and the present invention can be applied when there are no impurity regions 21, 22.

According to the manufacturing method of the semiconductor device according to the present invention, covering processing using the photolithography technique to prevent one impurity from being implanted into the other impurity region becomes unnecessary when a first conductivity type impurity region and a second conductivity type impurity region are provided in a semiconductor layer using contact holes, and it becomes possible to simplify manufacturing steps of the semiconductor device and to reduce the manufacturing cost.

Furthermore, in the manufacturing method of the semiconductor device, it is preferable that the opening shapes of the top ends of the first and second contact holes are substantially circular, and the implantation angle θ is determined so as to satisfy the conditional expression $T/h < \tan\theta < S/h$, where S represents the opening diameter of the first contact hole, T represents the opening diameter of the second contact hole and h represents the thickness of the insulating layer.

By setting the implantation angle of the impurity as described above, implantation of the impurity is allowed at the first contact hole but is blocked at the second contact hole, and thus formation of a photoresist to cover the second contact hole during the impurity implantation becomes unnecessary.

Furthermore, in the manufacturing method of the semiconductor device, it is preferable that the opening shape of the top end of the first contact hole is elliptical while that of the second contact hole is circular, and the implantation angle θ is determined so as to satisfy the conditional expression $T/h < \tan\theta < S/h$, where S reoresents the major axis dimension of the first contact hole, T represents the opening diameter of the second contact hole and h represents the thickness of the insulating layer. The first conductivity type impurity is implanted along the direction of the major axis dimension.

As described above, even when the opening shape of the top end of the contact hole is not circular but is elliptical, implantation of the impurity is allowed at the first contact hole but is blocked at the second contact hole, and thus formation of a photoresist to cover the second contact hole during the impurity implantation becomes unnecessary.

Furthermore, in the manufacturing method of the semiconductor device, it is preferable that the opening shapes of the top ends of the first and second contact holes are substantially elliptical and are provided such that the major axis direction of the first contact hole is orthogonal to that of the second contact hole.

The implantation angle θa is determined so as to satisfy the conditional expression $T3/h < \tan\theta a < S3/h$, where S3 represents the major axis dimension of the first contact hole, T3 represents the minor axis dimension of the second contact hole and h represents the thickness of the insulating layer. The first conductivity type impurity is implanted along the direction of the major axis dimension of the first contact hole.

In addition, the implantation angle θb is determined so as to satisfy the conditional expression $T4/h < \tan\theta b < S4/h$, where T4 represents the minor axis dimension of the first contact hole, S4 represents the major axis dimension of the second contact hole and h represents the thickness of the insulating layer. The second conductivity type impurity is implanted along the direction of the major axis dimension of the second contact hole.

By using the first and second contact holes having major axis directions that are orthogonal to each other as described above, when one impurity is implanted into one region, its implantation to the other region is blocked. As a result, formation of a photoresist to prevent one impurity from being implanted into the other impurity region becomes unnecessary. Consequently, manufacturing steps of the semiconductor device can further become simple, and the manufacturing cost can further be reduced.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A manufacturing method of a semiconductor device including a first conductivity type impurity region and a second conductivity type impurity region in a semiconductor layer, comprising the steps of:

forming on said semiconductor layer an insulating layer including a first contact hole having a top-end opening shape exposing a surface of semiconductor layer to implantation of an impurity at an implantation angle θ to a normal to said semiconductor layer and a second contact hole having a top-end opening shape, different from the top-end opening shape of the first contact hole and blocking a surface of said semiconductor layer to impurity implantation at said implantation angle θ;

implanting an impurity of a first conductivity type into said semiconductor layer at said implantation angle θ using said insulating layer as a mask to form said first conductivity type impurity region only in a surface portion of said semiconductor layer exposed by said first contact hole; and forming said second conductivity type impurity region only in a surface portion of said semiconductor layer exposed by said second contact hole by implantation using said second contact hole of said insulating layer.

2. The manufacturing method of a semiconductor device according to claim 1, wherein opening shapes of top ends of said first contact hole and said second contact hole are circular, and said implantation angle θ is determined so as to satisfy a conditional expression $$T/h < \tan\theta < S/h$$

where S represents an opening diameter of said first contact hole,

T represents an opening diameter of said second contact hole and h represents a thickness of said insulating layer.

3. The manufacturing method of a semiconductor device according to claim 1, wherein an opening shape of a top end of said first contact hole is elliptical;

an opening shape of a top end of said second contact hole is circular;

said implantation angle θ is determined so as to satisfy a conditional expression $$T/h < \tan\theta < S/h$$

where S represents a major axis dimension of said first contact hole,

T represents an opening diameter of said second contact hole and h represents a thickness of said insulating layer; and wherein said first conductivity type impurity is implanted along a direction of said major axis dimension.

4. The manufacturing method of a semiconductor device according to claim 1, wherein opening shapes of top ends of said first contact hole and said second contact hole are elliptical;

major axis directions of said first contact hole and said second contact hole are provided to be orthogonal to each other;

said implantation angle θ is determined so as to satisfy a conditional expression $$T3/h < \tan\theta < S3/h$$

where S3 represents a major axis dimension of said first contact hole,

T3 represents a minor axis dimension of said second contact hole and h represents a thickness of said insulating layer;

said first conductivity type impurity is implanted along a direction of a major axis dimension of said first contact hole;

said implantation angle θ is determined so as to satisfy a conditional expression $$T4/h < \tan\theta < S4/h$$

where T4 represents a minor axis dimension of said first contact hole,

S4 represents a major axis dimension of said second contact hole and h represents a thickness of said insulating layer; and wherein said second conductivity type impurity is implanted along a direction of a major axis dimension of said second contact hole.

5. The manufacturing method of a semiconductor device according to claim 1, wherein said first conductivity type impurity region includes one of p-type and n-type impurities, and said second conductivity type impurity region includes the other of p-type and n-type impurities.

* * * * *